US011496242B2

(12) United States Patent
Chandrasekher et al.

(10) Patent No.: US 11,496,242 B2
(45) Date of Patent: Nov. 8, 2022

(54) FAST CYCLIC REDUNDANCY CHECK: UTILIZING LINEARITY OF CYCLIC REDUNDANCY CHECK FOR ACCELERATING CORRECTION OF CORRUPTED NETWORK PACKETS

(71) Applicant: Aira Technologies, Inc., Saratoga, CA (US)

(72) Inventors: Anand Chandrasekher, Saratoga, CA (US); RaviKiran Gopalan, Cupertino, CA (US); Arman Rahimzamani, San Jose, CA (US)

(73) Assignee: Aira Technologies, Inc., Saratoga, CA (US)

( * ) Notice: Subject to any disclaimer, the term of this patent is extended or adjusted under 35 U.S.C. 154(b) by 0 days.

(21) Appl. No.: 17/556,029

(22) Filed: Dec. 20, 2021

(65) Prior Publication Data

US 2022/0294560 A1 Sep. 15, 2022

Related U.S. Application Data

(63) Continuation-in-part of application No. 17/202,210, filed on Mar. 15, 2021.

(51) Int. Cl.
*H04L 1/00* (2006.01)
*H03M 13/11* (2006.01)
*H03M 13/09* (2006.01)

(52) U.S. Cl.
CPC .......... *H04L 1/0061* (2013.01); *H03M 13/09* (2013.01); *H03M 13/1108* (2013.01); *H04L 1/0052* (2013.01)

(58) Field of Classification Search
CPC .... H04L 1/0061; H04L 1/0052; H03M 13/09; H03M 13/1108
See application file for complete search history.

(56) References Cited

U.S. PATENT DOCUMENTS 5,657,325 A 8/1997 Lou
5,910,182 A * 6/1999 Dent ................. H03M 13/2927
714/755

(Continued)

FOREIGN PATENT DOCUMENTS

CN 106487610 A 3/2017
GB 2493081 A 1/2013
WO WO2022081434 A1 4/2022

OTHER PUBLICATIONS

Grcar, "How ordinary elimination became Gaussian elimination", Historia Mathematica vol. 38, Issue 2, May 2011, pp. 163-218 (Year: 2011).*

(Continued)

*Primary Examiner* — April Y Blair
*Assistant Examiner* — Rong Tang
(74) *Attorney, Agent, or Firm* — Carr & Ferrell LLP

(57) ABSTRACT

Systems and methods for correcting corrupted network packets are provided. An example method includes receiving a network packet via a communication channel. The network packet includes a payload and a Cyclic Redundancy Check (CRC) associated with the payload. The method continues with calculating a reference CRC based on the received payload and determining, based on the reference CRC and the received CRC, whether the network packet is corrupted. Based on the determination that the network packet is corrupted, the method continues with selecting a predetermined number of positions of bits in the payload of the network packet, precalculating a set of additional CRCs, and determining, based on the reference CRC and the set of additional CRCs, a combination of bit flips at the predetermined number of positions. The method also includes modifying the payload according to the combination of bit flips at the predetermined number of positions.

16 Claims, 6 Drawing Sheets

(56) References Cited

U.S. PATENT DOCUMENTS

| | | | |
|---|---|---|---|
| 5,968,197 A * | 10/1999 | Doiron | H04L 1/1845 714/748 |
| 6,418,549 B1 | 7/2002 | Ramchandran | |
| 6,505,253 B1 | 1/2003 | Chiu | |
| 6,523,068 B1 | 2/2003 | Beser et al. | |
| 7,016,658 B2 | 3/2006 | Kim et al. | |
| 7,124,205 B2 | 10/2006 | Craft et al. | |
| 7,447,234 B2 | 11/2008 | Colas et al. | |
| 7,664,883 B2 | 2/2010 | Craft et al. | |
| 7,848,350 B1 | 12/2010 | Inamdar | |
| 7,971,131 B1 | 6/2011 | Ordentilch | |
| 8,223,643 B1 | 7/2012 | Wolfgang | |
| 8,305,963 B1 | 11/2012 | Breau | |
| 8,327,232 B2 | 12/2012 | Budampati et al. | |
| 8,352,830 B2 | 1/2013 | Landschaft et al. | |
| 8,437,267 B2 | 5/2013 | Amir et al. | |
| 8,473,821 B2 | 6/2013 | Taghavi Nasrabadi et al. | |
| 8,693,406 B2 | 4/2014 | Ahmadi | |
| 8,990,663 B2 | 3/2015 | Liu et al. | |
| 10,270,564 B2 | 4/2019 | Djukic et al. | |
| 10,491,569 B1 | 11/2019 | Powell | |
| 10,749,594 B1 | 8/2020 | O'Shea et al. | |
| 11,088,784 B1 | 8/2021 | Gopalan et al. | |
| 11,191,049 B1 | 11/2021 | Chandrasekher et al. | |
| 11,368,250 B1 | 6/2022 | Chandrasekher et al. | |
| 11,368,251 B1 | 6/2022 | Chandrasekher et al. | |
| 2001/0030954 A1 | 10/2001 | Hameleers | |
| 2002/0026523 A1 | 2/2002 | Mallory et al. | |
| 2002/0054608 A1 | 5/2002 | Wan | |
| 2002/0122510 A1 | 9/2002 | Yakhnich et al. | |
| 2003/0215029 A1 | 11/2003 | Limberg | |
| 2004/0170120 A1 | 9/2004 | Reunamaki et al. | |
| 2005/0094561 A1 | 5/2005 | Raaf | |
| 2005/0208897 A1 | 9/2005 | Lyons | |
| 2006/0021040 A1 | 1/2006 | Boulanger | |
| 2006/0047862 A1 | 3/2006 | Shearer et al. | |
| 2006/0268996 A1 | 11/2006 | Sethi et al. | |
| 2007/0168197 A1 | 7/2007 | Vasilache | |
| 2008/0002688 A1 | 1/2008 | Kim et al. | |
| 2008/0002790 A1 | 1/2008 | Itoh | |
| 2008/0126824 A1 | 5/2008 | Lee et al. | |
| 2008/0225735 A1 | 9/2008 | Qiu | |
| 2008/0250299 A1 | 10/2008 | Maillet et al. | |
| 2009/0086711 A1 | 4/2009 | Capretta et al. | |
| 2009/0119566 A1 | 5/2009 | Hiromitsu | |
| 2009/0125779 A1 | 5/2009 | Vermeiden et al. | |
| 2009/0276686 A1 | 11/2009 | Liu et al. | |
| 2010/0037270 A1 | 2/2010 | Bennett | |
| 2010/0165868 A1 | 7/2010 | Gersemsky | |
| 2010/0192175 A1 | 7/2010 | Bachet | |
| 2010/0202416 A1 | 8/2010 | Wilhelmsson et al. | |
| 2010/0262885 A1 | 10/2010 | Cheng | |
| 2011/0131461 A1 | 6/2011 | Schulz | |
| 2011/0206019 A1 | 8/2011 | Zhai et al. | |
| 2011/0206065 A1 | 8/2011 | Kim et al. | |
| 2011/0216787 A1 | 9/2011 | Ai et al. | |
| 2012/0300642 A1 | 11/2012 | Abel et al. | |
| 2013/0018889 A1 | 1/2013 | Jagmohan | |
| 2013/0132786 A1 | 5/2013 | Tanigawa et al. | |
| 2013/0198591 A1 | 8/2013 | Kamuf et al. | |
| 2013/0223203 A1 | 8/2013 | Bai | |
| 2013/0250179 A1 | 9/2013 | Lida | |
| 2013/0339036 A1 | 12/2013 | Baeckstroem et al. | |
| 2014/0140342 A1 | 5/2014 | Narad | |
| 2014/0241309 A1 * | 8/2014 | Hilton | H04B 3/54 370/468 |
| 2015/0009902 A1 | 1/2015 | Emmanuel | |
| 2016/0006842 A1 | 1/2016 | Tahir | |
| 2016/0062954 A1 | 3/2016 | Ruff | |
| 2016/0254881 A1 | 9/2016 | Meylan | |
| 2016/0261375 A1 | 9/2016 | Roethig | |
| 2017/0006616 A1 | 1/2017 | Singh et al. | |
| 2017/0012799 A1 | 1/2017 | Jiang | |
| 2017/0269876 A1 | 9/2017 | Mukhopadhyay et al. | |
| 2018/0013808 A1 | 1/2018 | Petry et al. | |
| 2018/0048567 A1 | 2/2018 | Ignatchenko | |
| 2018/0101957 A1 | 4/2018 | Talathi | |
| 2018/0267850 A1 | 9/2018 | Froelich et al. | |
| 2018/0288198 A1 | 10/2018 | Pope et al. | |
| 2018/0314985 A1 | 11/2018 | O'Shea | |
| 2018/0359811 A1 | 12/2018 | Verzun et al. | |
| 2019/0028237 A1 | 1/2019 | Pan et al. | |
| 2019/0037052 A1 | 1/2019 | Deshpande | |
| 2019/0097680 A1 | 3/2019 | O'Brien | |
| 2019/0097914 A1 | 3/2019 | Zhong et al. | |
| 2019/0392266 A1 | 12/2019 | Zhong et al. | |
| 2019/0393903 A1 | 12/2019 | Mandt et al. | |
| 2020/0099470 A1 | 3/2020 | Licardie | |
| 2020/0128279 A1 | 4/2020 | Han et al. | |
| 2020/0177418 A1 | 6/2020 | Hoydis et al. | |
| 2020/0213152 A1 | 7/2020 | Choquette et al. | |
| 2020/0320371 A1 | 10/2020 | Baker | |
| 2020/0383169 A1 | 12/2020 | Takahashi et al. | |
| 2021/0014939 A1 | 1/2021 | Verzun et al. | |
| 2021/0034846 A1 | 2/2021 | Ko et al. | |
| 2021/0056058 A1 | 2/2021 | Lee et al. | |
| 2021/0120440 A1 | 4/2021 | Reimann et al. | |
| 2021/0319286 A1 | 10/2021 | Gunduz | |
| 2021/0392033 A1 | 12/2021 | Haartsen | |
| 2022/0045696 A1 | 2/2022 | Boussard | |
| 2022/0114436 A1 | 4/2022 | Gopalan et al. | |
| 2022/0209893 A1 | 6/2022 | Chandrasekher et al. | |
| 2022/0209894 A1 | 6/2022 | Chandrasekher et al. | |
| 2022/0209895 A1 | 6/2022 | Chandrasekher et al. | |
| 2022/0209896 A1 | 6/2022 | Gopalan et al. | |
| 2022/0209897 A1 | 6/2022 | Jiang et al. | |
| 2022/0209909 A1 | 6/2022 | Chandrasekher et al. | |
| 2022/0210250 A1 | 6/2022 | Chandrasekher et al. | |
| 2022/0294557 A1 | 9/2022 | Gopalan et al. | |

OTHER PUBLICATIONS

Kim et al., "Deepcode: Feedback Codes via Deep Learning," [online] Jul. 2, 2018 [retrieved on Apr. 17, 2020], Retrieved from the Internet: <URL:https://arxiv.org/abs/1807.00801v1>, 24 pages.

Gopalan et al., "Systems and Methods for Artificial Intelligence Discovered Codes", U.S. Appl. No. 17/069,794, filed Oct. 13, 2020, Specification, Claims, Abstract, and Drawings, 43 pages.

Goutay et al., "Deep reinforcement learning autoencoder with noisy feedback." 2019 International Symposium on Modeling and Optimization in Mobile, Ad Hoc, and Wireless Networks (WiOPT). IEEE. Jun. 24, 2019, 6 pages.

Yamamoto et al., "Application of Yamamoto-Itoh coding scheme to discrete memoryless broadcast channels." 2017 IEEE International Symposium on Information Theory (ISIT). IEEE, 2017, 5 pages.

Aoudia et al., "End-to-end learning of communications systems without a channel model." 2018 52nd Asilomar Conference on Signals, Systems, abd Computers. IEEE, Dec. 5, 2018, 6 pages.

Duman et al., "On optimal power allocation for turbo codes." Proceedings of IEEE International Symposium on Information Theory. IEEE, Jun. 29-Jul. 4, 1997, 1 page.

Arvinte et al., "Deep Log-likelihood ration quantization." 2019 27th European Signal Processing Conference (EUSIPCO). IEEE, 2019, 5 pages.

"International Search Report" and "Written Opinion", Patent Cooperation Treaty Application No. PCT/US2021/054265, dated Nov. 24, 2021, 24 pages.

"International Search Report" and "Written Opinion", Patent Cooperation Treaty Application No. PCT/US2021/0063356, dated Jan. 14, 2022, 9 pages.

"International Search Report" and "Written Opinion", Patent Cooperation Treaty Application No. PCT/US2021/061902, dated Jan. 24, 2022, 11 pages.

Henze, Martin, "A Machine-Learning Packet-Classification Tool for Processing Corrupted Packets on End Hosts", Diploma Thesis, Chair of Communication and Distributed Systems, RWTH Aachen University, Mar. 2011, 103 pages.

"International Search Report" and "Written Opinion", Patent Cooperation Treaty Application No. PCT/US2021/06617, dated Mar. 11, 2022, 12 pages.

(56) References Cited

OTHER PUBLICATIONS

Kötter et al., "Coding for Errors and Erasures in Random Network Coding", IEEE Transactions on Information Theory 54.8; 3579-3591. Mar. 25, 2008; Retrieved on Feb. 19, 2022 (Feb. 19, 2022) from <https://arvix.org/pdf/cs/0703061.pdf> entire document; 30 pages.
"International Search Report" and "Written Opinion", Patent Cooperation Treaty Application No. PCT/US2021/064735, dated Mar. 17, 2022, 11 pages.
"International Search Report" and "Written Opinion", Patent Cooperation Treaty Application No. PCT/US2021/065003, dated Mar. 22, 2022, 10 pages.
"International Search Report" and "Written Opinion", Patent Cooperation Treaty Application No. PCT/US2021/064999, dated May 4, 2022, 14 pages.

\* cited by examiner

FAST CYCLIC REDUNDANCY CHECK: UTILIZING LINEARITY OF CYCLIC REDUNDANCY CHECK FOR ACCELERATING CORRECTION OF CORRUPTED NETWORK PACKETS

CROSS REFERENCE TO RELATED APPLICATIONS

The present application is a Continuation-in-Part of U.S. application Ser. No. 17/202,210, filed on Mar. 15, 2021 and titled "ERROR CORRECTION IN NETWORK PACKETS," the subject matter of which is incorporated herein by reference for all purposes.

TECHNICAL FIELD

The present disclosure relates generally to data processing, and, more specifically, to systems and methods for correcting corrupted network packets using linearity of a cyclic redundancy check.

BACKGROUND

A Cyclic Redundancy Check (CRC) is a short error-detecting code used to verify accidental changes to data packet payloads during data transfers. The CRC is a relatively fast and efficient error-detection method used in almost any modern communication system. Typically, the CRC is computed on the payload at the transmitter side and attached to the end of the payload. Both payload and the CRC are transmitted to the receiver side. At the receiver, the received CRC is compared to the CRC computed based on the received payload. If the received CRC equals the computed CRC, the received packet has no errors. On the other hand, if the received CRC does not match the computed CRC, the CRC fails and the received packet has errors.

For Bluetooth™ transmissions, the CRC is 3 bytes. When the CRC passes, it is of very high probability that the packet has no errors, so an acknowledgement (ACK) is sent to the transmitter and the transmitter can proceed to transmitting the next packet. When the CRC fails, it is of very high probability that the packet has errors, so a negative acknowledgement (NACK) is sent, indicating a request for retransmission. When the transmitter receives ACK, it may transmit the next packet, and when the transmitter receives NACK, it may retransmit the packet. Retransmitting packets from the transmitter to the receiver every time the CRC fails results in reduced bandwidth of the communication channel.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Embodiments of the present disclosure are directed to correcting corrupted network packets and reducing complexity of wireless data verifications using linearity of a CRC. According to an example embodiment, a method and a system for correcting corrupted network packets using linearity of a CRC are provided. The method may commence with receiving a network packet via a communication channel. The network packet may include a payload and a CRC associated with the payload. The method may continue with calculating a reference CRC based on the received payload. The method may include determining, based on the reference CRC and the received CRC, that the network packet is corrupted.

In response to the determination that the network packet is corrupted, the method may continue with selecting a predetermined number of positions of bits in the payload of the network packet. The predetermined number positions of bits in the payload may be less than a length of the payload. In an example embodiment, the predetermined number of positions of bits may be selected based on at least one previous version of the payload transferred over the communication channel.

The method may further include precalculating a set of additional CRCs. An additional CRC of the set additional CRCs is calculated based on a sequence of a set of sequences B of bits of a length of the payload. The sequence includes a single non-zero bit at one of the predetermined number of positions. In an example embodiment, the calculation of the additional CRC of the set additional CRCs requires fewer operations than a calculation of the reference CRC. The set of additional CRCs may be obtained from a set of precalculated CRCs for sequences of bits of a length of the payload. Each of the sequences may include a single non-zero bit position.

The method may further include determining, based on the reference CRC and the set of additional CRCs, a combination of bit flips at the predetermined number of positions. The combination of bit flips corresponds to a combination of the sequences B such thus a sum of the reference CRC and CRCs of the combination of the sequences B matches the received CRC. In an example embodiment, the determination of the combination of bit flips may include iteratively performing the following operations. First, a test combination of the sequences B is selected. Second, a test sum of the reference CRC and the additional CRCs corresponding to the test combination sequences B are calculated. Third, it is determined whether the test sum matches the received CRC.

In an example embodiment, the determination of the combination of bit flips may include generating a set of linear equations. A linear equation of the set of linear equations may correspond to one of possible combinations of the sequences B. The set of linear equations may be solved to determine the combination of the sequences B. In an example embodiment, the set of linear equations may be solved by a Gaussian elimination method. The method may include modifying the payload according to the combination of bit flips at the predetermined number of positions.

In an example embodiment, after selecting the predetermined number of positions of bits in the payload of the network packet, the method may proceed with calculating a binary tree. Nodes of the binary tree may correspond to CRCs of parts of the payload and leaves of the binary tree may correspond to CRCs of payloads modified, according to possible combinations of bit flips at the predetermined positions. Upon calculation of the binary tree, the combination of the bit flips corresponding to CRC matching the received CRC is selected based on the leaves. Each of the nodes of the binary tree corresponds to a first branch and a second branch. The first branch corresponds to a first partial payload obtained by flipping a bit at one of the predetermined positions. The second branch corresponds to a second partial payload having the bit at the one of the predetermined positions unchanged.

According to another embodiment, a system for correcting corrupted network using linearity of a CRC packets can be provided. The system may include at least one processor and a memory storing processor-executable codes, wherein the processor can be configured to implement the operations of the above-mentioned method for correcting corrupted network packets.

According to yet another aspect of the disclosure, there is provided a non-transitory processor-readable medium, which stores processor-readable instructions. When the processor-readable instructions are executed by a processor, they cause the processor to implement the above-mentioned method for error correction in network packets.

Additional objects, advantages, and novel features will be set forth in part in the detailed description section of this disclosure, which follows, and in part will become apparent to those skilled in the art upon examination of this specification and the accompanying drawings or may be learned by production or operation of the example embodiments. The objects and advantages of the concepts may be realized and attained by means of the methodologies, instrumentalities, and combinations particularly pointed out in the appended claims.

BRIEF DESCRIPTION OF THE DRAWINGS

Embodiments are illustrated by way of example and not limitation in the figures of the accompanying drawings, in which like references indicate similar elements.

DETAILED DESCRIPTION

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is, therefore, not to be taken in a limiting sense, and the scope is defined by the appended claims and their equivalents.

The present disclosure provides systems and methods for correcting corrupted network packets using linearity of a Cyclic Redundancy Check (CRC). An example method for correcting corrupted network packets may commence with receiving a network packet via a communication channel. The network packet may include a payload and a CRC associated with the payload. The method may allow calculating a reference CRC based on the received payload. The method may continue with determining, based on the reference CRC and the received CRC, whether the network packet is corrupted. In response to the determination, a predetermined number of positions of bits in the payload of the network packet is selected. The method may further include precalculating a set of additional CRCs. An additional CRC of the set additional CRCs may be calculated based on a sequence of a set of sequences B of bits of a length of the payload. The sequence may include a single non-zero bit at one of the predetermined number of positions. Based on the reference CRC and the set of additional CRCs, a combination of bit flips at the predetermined number of positions may be determined. The combination of bit flips may correspond to a combination of the sequences B such that a sum of the reference CRC and CRCs of the combination of the sequences B matches the received CRC. The method may continue with modifying the payload according to the combination of bit flips at the predetermined number of positions.

Figure 1:
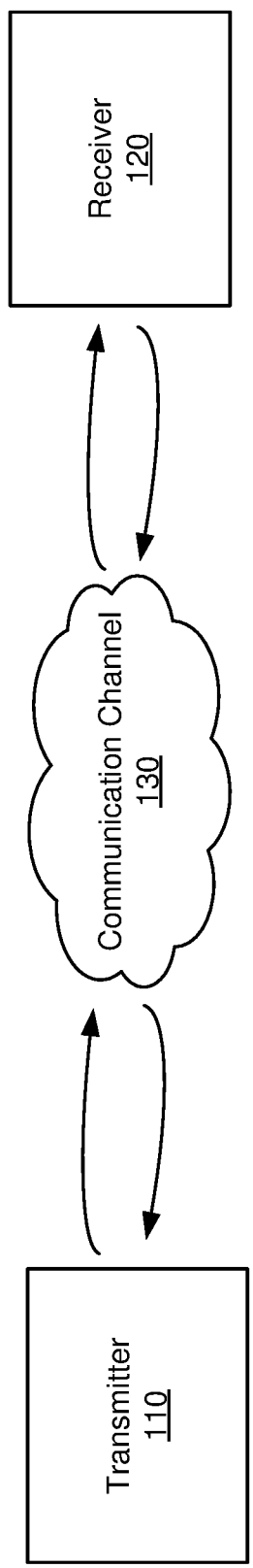
FIG. 1 is a block diagram of an environment, in which systems and methods for correcting corrupted network packets using linearity of a CRC can be implemented, according to some example embodiments.

Referring now to the drawings, FIG. 1 is a block diagram of environment 100, in which systems and methods for correcting corrupted network packets using linearity of a CRC can be implemented, according to some example embodiments. The environment 100 may include a transmitter 110, a receiver 120, and a communication channel 130. The transmitter 110 may send network packets over the communication channel 130. The receiver 120 may receive the network packets and analyze integrity of the network packets. Based on the analysis, the receiver 120 may determine that a network packet is corrupted. The receiver 120 may be configured to request that the transmitter 110 retransmit the network packet.

In various embodiments, the transmitter 110 or the receiver 120 may include a computer (e.g., a laptop computer, a tablet computer, and a desktop computer), a server, a cellular phone, a smart phone, a gaming console, a multimedia system, a smart television device, wireless headphones, an infotainment system, an in-vehicle computing device, an informational kiosk, a smart home computer, a software application, a computer operating system, a modem, a router, and so forth.

The communication channel 130 may include the Internet or any other network capable of communicating data between devices. Suitable networks may include or interface with any one or more of, for instance, a local intranet, a corporate data network, a data center network, a home data network, a Personal Area Network, a Local Area Network (LAN), a Wide Area Network (WAN), a Metropolitan Area Network, a virtual private network, a storage area network, a frame relay connection, an Advanced Intelligent Network connection, a synchronous optical network connection, a digital T1, T3, E1 or E3 line, Digital Data Service connection, Digital Subscriber Line connection, an Ethernet connection, an Integrated Services Digital Network line, a dial-up port such as a V.90, V.34 or V.34bis analog modem connection, a cable modem, an Asynchronous Transfer Mode connection, or a Fiber Distributed Data Interface or Copper Distributed Data Interface connection. Furthermore, communications may also include links to any of a variety of wireless networks, including Wireless Application Protocol, General Packet Radio Service, Global System for Mobile Communication, Code Division Multiple Access or Time Division Multiple Access, cellular phone networks, Global Positioning System, cellular digital packet data, Research in Motion, Limited duplex paging network, Bluetooth™ radio, or an IEEE 802.11-based radio frequency network. The communication channel 130 can further include or interface with any one or more of a Recommended Standard 232 (RS-232) serial connection, an IEEE-1394 (FireWire) connection, a Fiber Channel connection, an IrDA (infrared) port, a Small Computer Systems Interface connection, a Universal Serial Bus (USB) connection or other wired or wireless, digital or analog interface or connection, mesh or Digi® networking.

Figure 2:
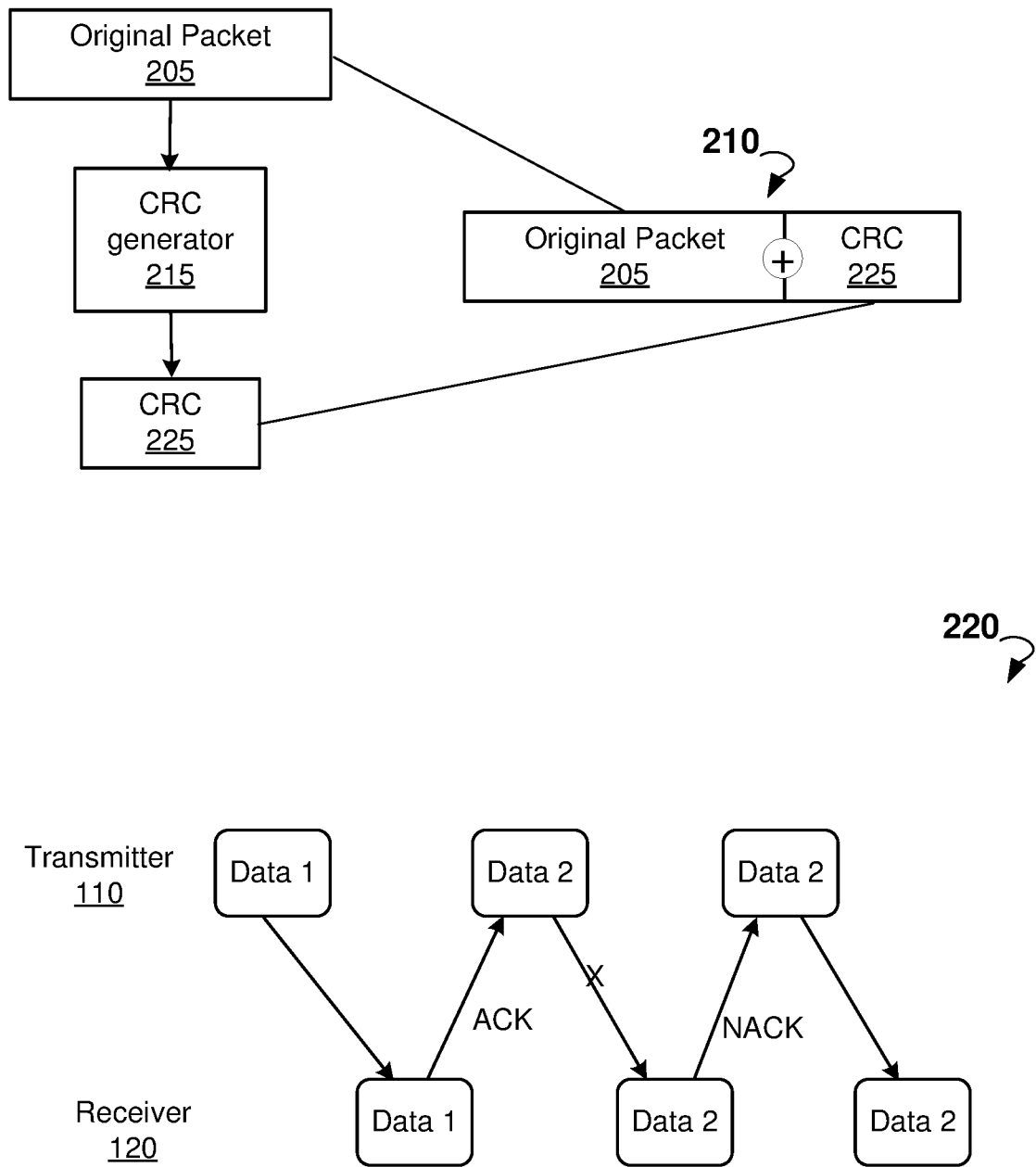
FIG. 2 is a block diagram showing an example network packet and an automatic repeat request method for data transmission, according to some example embodiments.

FIG. 2 is a block diagram showing an example network packet 210 and an automatic repeat request (ARQ) method 220 for data transmission, according to some example embodiments.

A transmitter 110 may send, via a communication channel 130, a network packet including a binary message $x \in \{0,1\}^n$. A receiver 120 may receive a binary message $y \in \{0,1\}^n$, which is the message x corrupted by the communication channel 130. The message can be corrupted due to the noise in communication channels, which is typically the main cause of packet loss. The packet loss results in defects, such as reduced throughput of transmitted data, degraded audio quality, and so forth. Typically, communication schemes such as CRC and the ARQ are used to mitigate the packet loss.

A CRC 225 is an error detection check used to determine whether a network packet is corrupted. The CRC 225 is generated by a CRC generator 215 based on an original packet 205 and added to the original packet 205 (the payload) to form the network packet 210. The network packet 210 is transmitted from the transmitter 110 to the receiver 120 via the communication channel 130. The CRC 225 is typically of a fixed length (e.g., 3 bytes) regardless of the length of the payload. When the network packet with the CRC 225 is received, the receiver 120 computes the new CRC based on payload of the received the network packet and compares the new CRC to the appended CRC 225. If the appended CRC 225 mismatches the new CRC computed from the received payload, the network packet 210 is corrupted.

ARQ is a communication method in which if the network packet 210 is detected as corrupted, the receiver 120 requests the transmitter 110 to retransmit the network packet 210. The ARQ stops when the network packet 210 is received correctly or the maximum timeout is reached. Typically, ARQ discards previous versions of received network packets, and therefore information from previously received packets is not used.

ARQ+CRC is an approach widely used in Bluetooth™, Wi-Fi™, and 3G/4G/LTE/5G networks. However, ARQ+CRC is not efficient because even if only 1-bit in the received network packet 210 is wrong (resulting in a CRC check failure), the whole network packet 210 is retransmitted. Thus, Block Error Rate (BLER) of ARQ+CRC scheme can be lower than desired.

According to embodiments of the present disclosure, prior to requesting retransmission of the network packet 210, the receiver 120 can modify a few bits in the payload of the received network packet and test the CRC again. Given a payload of length L, and assuming that k-bits in the payload are erroneous, modifying (by flipping) all possible k-bits in the payload would require checking CRC $2^{\wedge}$(L choose k) times. This is computationally infeasible. Therefore, using this approach, all the $2^{\wedge}$(L choose k) combinations for k bit locations have to be flipped in the worst case scenario, one by one, to see which combination (out of a total of $2^{\wedge}$(L choose k) combinations) would make the CRC pass. This approach results in an exponential complexity and, therefore, is unscalable.

As a first step to solve this issues, soft information may be extracted to determine which bits in the payload are most unreliable (uncertain). The soft information may include expected values of bits, also referred to as soft likelihoods. A method for modifying the unreliable bits to test CRC maybe used, without drastically reducing the validity of the CRC.

In conventional ARQ schemes, when the network packet 210 is retransmitted, the previous copies of the network packet are discarded and not used. The performance of the ARQ may be improved by using a simple voting scheme. The voting scheme can use all received copies of a network packet to make a vote on each bit in the network packet and output the majority voted result. Then, the result of the voting can be used to test the CRC.

Typically, channel errors are modeled as independent and identically distributed (i.i.d.) errors. However, the errors observed in real systems are correlated to each other. The correlation of errors originated from two sources: 1) a design of a communication channel, for example Bluetooth™'s Gaussian frequency-shift keying (GFSK) modulation which can cause error correlations; and 2) burst noise and interference in electronic circuits of transmitters and receivers.

Figure 3:
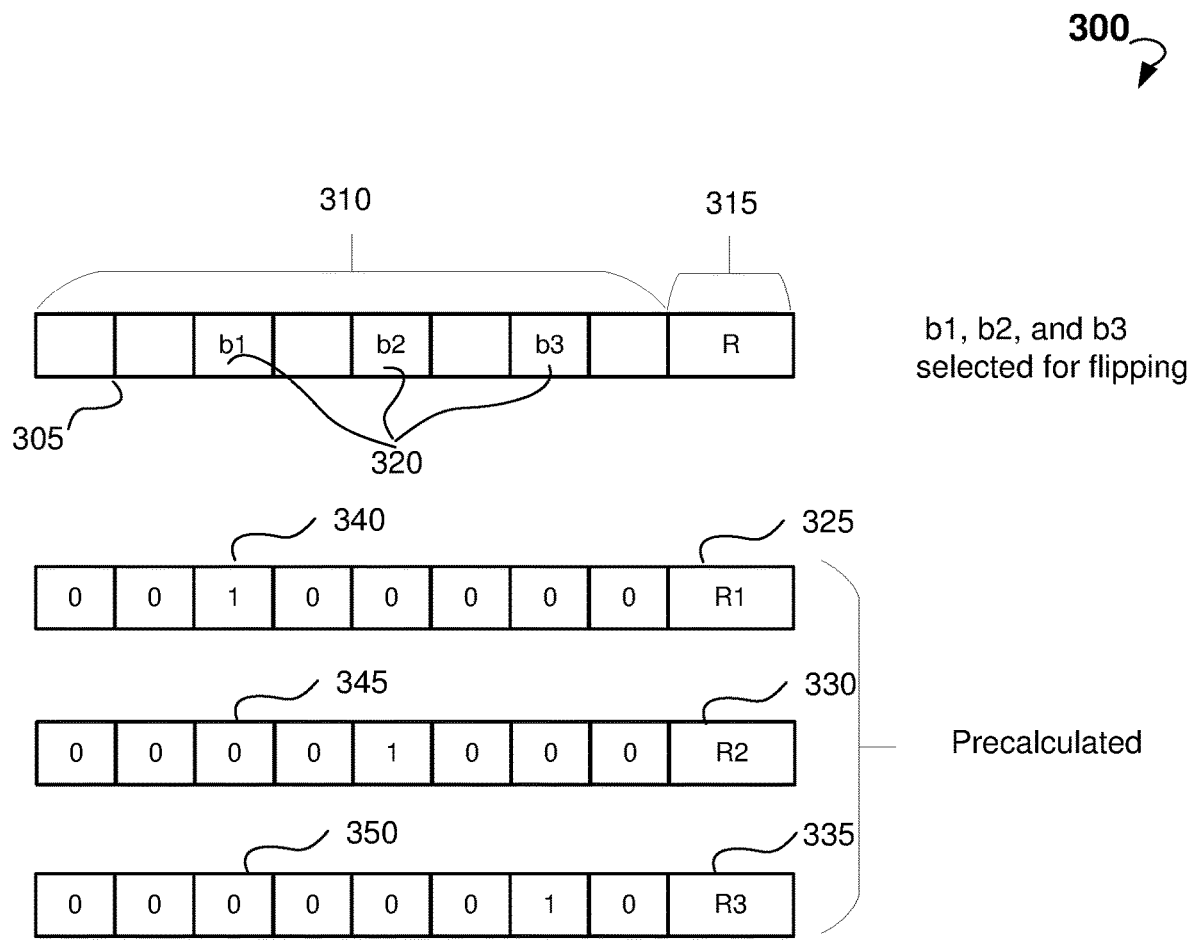
FIG. 3 is a schematic diagram illustrating operations performed to identify erroneous bits in network packets, according to an example embodiment.

FIG. 3 is a schematic diagram 300 illustrating operations performed to identify erroneous bits in network packets, according to an example embodiment.

To compute the CRC on the payload of a network packet, a CRC polynomial is used. The CRC polynomial is used to process all bits in a Protocol Data Unit (PDU) in a transmitted order starting from the least significant bit. The polynomial is linear in nature and has the form of $x^{24}+x^{10}+x^9+x^6+x^4+x^3+x+1$.

In the approaches described herein, a list decoding may be used to create a list of possible correct packets rather than uniquely decoding the received noisy sequence into a single packet. Because calculating the CRC is linear in nature, the data sequence for which the CRC is calculated can be split into segments and the CRC can be calculated separately for each segment in parallel. Thus, a further step is used to detect the correct packet from the list, such as checking the CRC for all the packets in the list, one by one, to find a packet that would pass the CRC.

FIG. 3 shows a network packet 305 that is received via a communication channel. The network packet 305 may have a payload 310 and a CRC 315. Bits at locations b1, b2, and b3 shown as locations 320 may be determined as erroneous and may be selected for flipping. A set of additional CRCs 325, 330, and 335 may be precalculated. Each additional CRC 325, 330, and 335 is calculated based on a sequence of a set of sequences B 340, 345, and 350 of bits of a length of the payload.

The CRC is a linear operation, i.e.:

$$CRC(A+B)=CRC(A)+CRC(B)+CRC(0),$$

$$CRC(A+B+C)=CRC(A)+CRC(B)+CRC(C).$$

In these equations, 0 is an all-zeros sequence of the same length as A and B. This property can be utilized to drastically reduce the time complexity. The linearity of CRC can be used in identifying corrupted network packets and reducing complexity of wireless data verifications.

In step 1, there is a sequence R, which is the output of a neural packet processor (NPP). The NPP method may combine ARQ, CRC, and soft information processing. In general, the NPP method includes the following: (1) checking the CRC of the received network packet, and, if the CRC fails, then (2) using previously received network packets to extract soft information to propose multiple alternative sequences of bits and to check the CRC again. The NPP may consist of two major parts: (1) using the soft information to generate k most uncertain locations, and propose 2^k alternative candidates to test CRC, and (2) a data-driven method to extract soft information from received packets.

In the approach described herein, the system performs the bit flipping at k indices {b1, b2, . . . , bk} and calculates the CRC for all possible $2^k$ combinations. Therefore, the system precalculates the following CRCs, which are a total of k+2 CRC calculations as well as k 3-byte XOR operations:

$$R'=CRC(R),$$

$$B1=CRC(e\_b1)+CRC(0),$$

$$B2=CRC(e\_b2)+CRC(0)\ldots,$$

$$Bk=CRC(e\_bk)+CRC(0),$$

$$R1=R+b1=[00000010000000\ldots 0],$$

$$R2=R+b2=[00000001000000\ldots 0],$$

$$R3=R+[00000000100000\ldots 0],$$

$$R4=R+[00000011000000\ldots 0],$$

$$R5=R+[00000011100000\ldots 0],$$

$$R6=R+b6=[00000001100000\ldots 0].$$

Using a naive approach, CRC(R1), CRC(R2), . . . , CRC(R8) are computed. Then, it is checked whether any of these CRCs matches the CRC associated with the payload.

Then, a substep a) includes the following calculations:

$$CRC(R1)=CRC(R)+CRC(b1)+CRC(0),$$

$$CRC(R2)=CRC(R)+CRC(b2)+CRC(0)\ldots,$$

$$CRC(R8)=CRC(R)+CRC(b8)+CRC(0).$$

The substep b) includes the following calculations:

$$CRC(R1)=CRC(R)+CRC(b1)+CRC(0),$$

$$CRC(R2)=CRC(R)+CRC(b2)+CRC(0)\ldots,$$

$$CRC(R8)=CRC(R)+CRC(b1)+CRC(b3).$$

In these equations, {e_bk} is an all-zeros sequence of the same length as R and 0, except for the bit index bk, which is set to 1.

In step 2, for any bit flip combination, the CRC can be calculated as a 3-byte XOR operations:

$$CRC=R'+\text{sum}\_\{k:bk=1\}Bk.$$

Although step 2 is still exponential, it consists of much faster and shorter operations: each sequential XOR operation for 3 bytes can be done in a single clock cycle which can be, for example, 15 ns on an ARM Cortex-M4 microcontroller at 64 Mhz, which would be a total of $2^{**}k*15$ ns for the worst case scenario.

Equations 355 and 360 shown in FIG. 3 can be used for the calculation:

$$P_{test} = P + \sum_{k \in combination} P \cdot xor \cdot eb_k,$$

$$CRC(P_{test}) = R + \sum_{k \in combination} R_k.$$

As determined based on the simulations performed for the calculations described above, in this approach the bit flip and CRC check can be run for k=7 as fast as what it would take with an approach for k=4.

In an example embodiment, the bit flip {bk} may be located over the CRC itself. In this embodiment, Bk' may be equal to a 3-byte (i.e., 24-bit) unit vector [0 0 0 0 1 0 . . . 0] where the location of 1 is exactly the same as the uncertain bit index bk over the CRC itself. Therefore, when XORing with Bk, the CRC bit that is the most uncertain is automatically flipped.

In an example embodiment, the set of linear equations is solved by the Gaussian elimination method. In this method, the complexity of step 1 is reduced to linear with respect to k. The step 2, however, is still of exponential complexity (even though the coefficient is relatively smaller than the naive approach) which can increase the required computation time significantly for large k values.

In step 2, the purpose is to obtain a set of binary coefficients $x_1, \ldots, x_k$ such that:

$$CRC(R)+x_1B_1+x_2B_2+\ldots+x_kB_k=CRC_{Intended}.$$

If such set of $x_k$ coefficients exists, a CRC pass is declared and the correct sequence is returned accordingly, otherwise a CRC fail is declared and the method continues with waiting for more sequences to arrive at the NPP.

Therefore, a linear equation set is solved in a binary space. The set of equations can be formulated as follows:

$$[B_1^T|B_2^T|\ldots|B_k^T]x=(CRC_{Intended}+CRC(R))^T$$

This set consists of 24 equations (i.e., the same as the CRC size). A standard way for solving such equations is the Gaussian elimination method consisting of two basic row operations in the binary field: a) swapping any two arbitrary rows, and b) adding any arbitrary row to another arbitrary row.

By applying the two operations above sequentially in a systematic way, the linear equations above can be transformed into the following form:

$$[I_{k\times k}|0_{k\times(24-k)}]^T x=[\alpha_{1\times k}|\beta_{1\times(24-k)}]^T.$$

If vector β is all 0s, then it means that the equation set has a valid answer for x, and the answer is equal to the vector α. Therefore, the valid combination of bit flips can be found and the corrected sequence can be returned. On the other hand, β≠0 means that the equation has no answer, hence there is no valid combination of bit flips that passes the CRC and, therefore, a CRC fail is declared. Thus, the operations described above can be used to reduce the complexity of the list decoding to fully linear.

Figure 4:
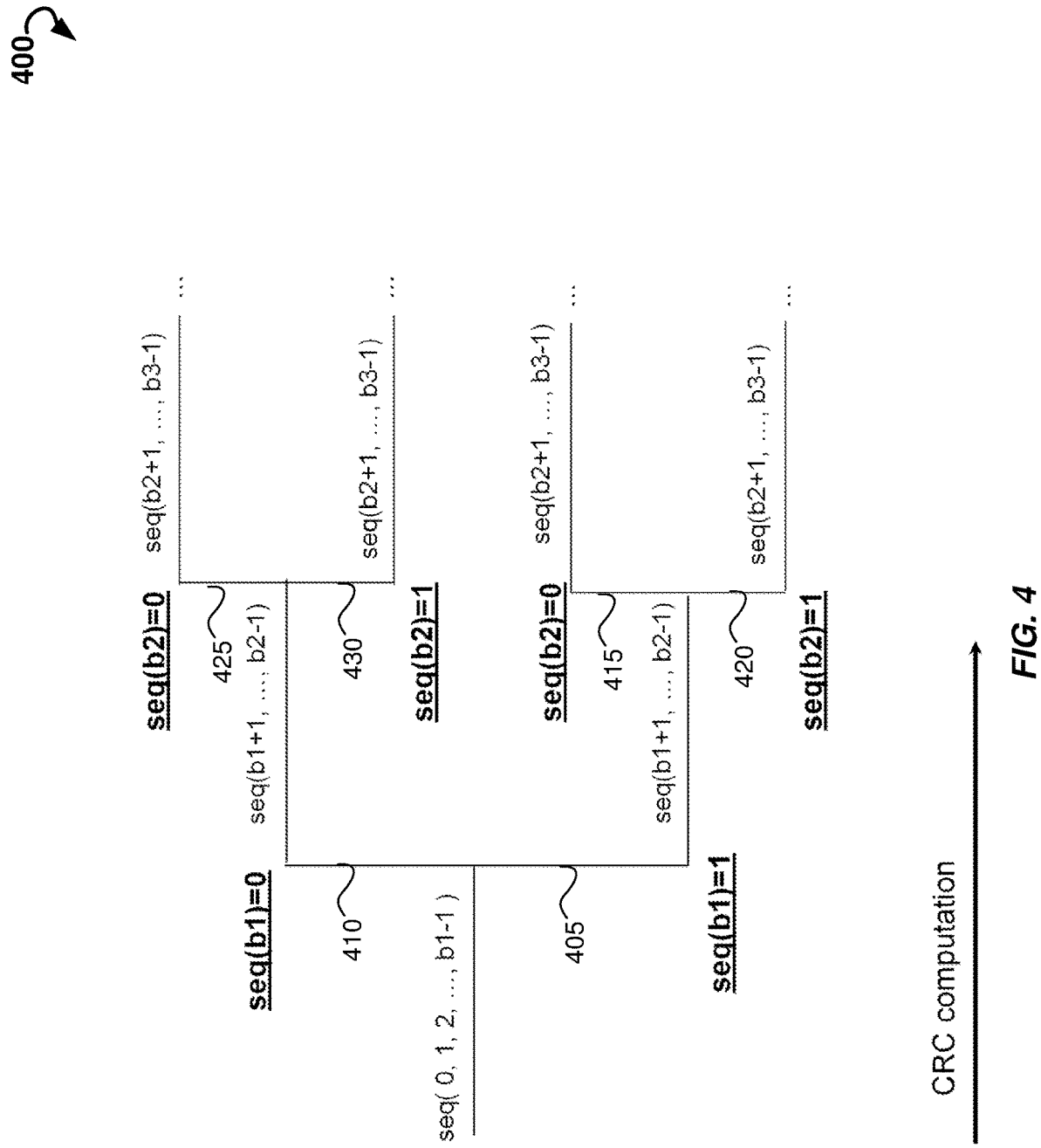
FIG. 4 shows a branch structure used by a system for correcting corrupted network packets using linearity of a CRC, according to an example embodiment.

FIG. 4 shows a branch structure 400 used by the system for correcting corrupted network packets, according to an example embodiment. The CRC is a sequential operation, i.e., if two sequences are identical from bit location 0 to bit location b−1 with only bit b being the first non-equal bit, there is no need to repeat the operations for the section where two sequences are equal. This results in the fact that up to bit b−1 for one sequence can be stored and recycled. If there are k bit locations to be flipped, there is a need to calculate the CRC for $2^k$ sequences separately. The results can be recycled for the identical sections of the sequences. If the first bit flip happens at location b1, all $2^k$ may have the same CRC register value up to location b1-1 since all of them are identical up to the location b1. Therefore, there is only one single branch before location b1, then at b1 the sequences divide into two branches: half of them has b1=1 (see a branch 405), and the other half has b1=0 (see a branch 410). Then, the CRC is calculated for the two branches 405 and 410 until the next bit flip location b2, where there may be another branching from two sequences to four sequences, see branches 415 and 420 and branches 425 and 430, respectively.

Figure 5:
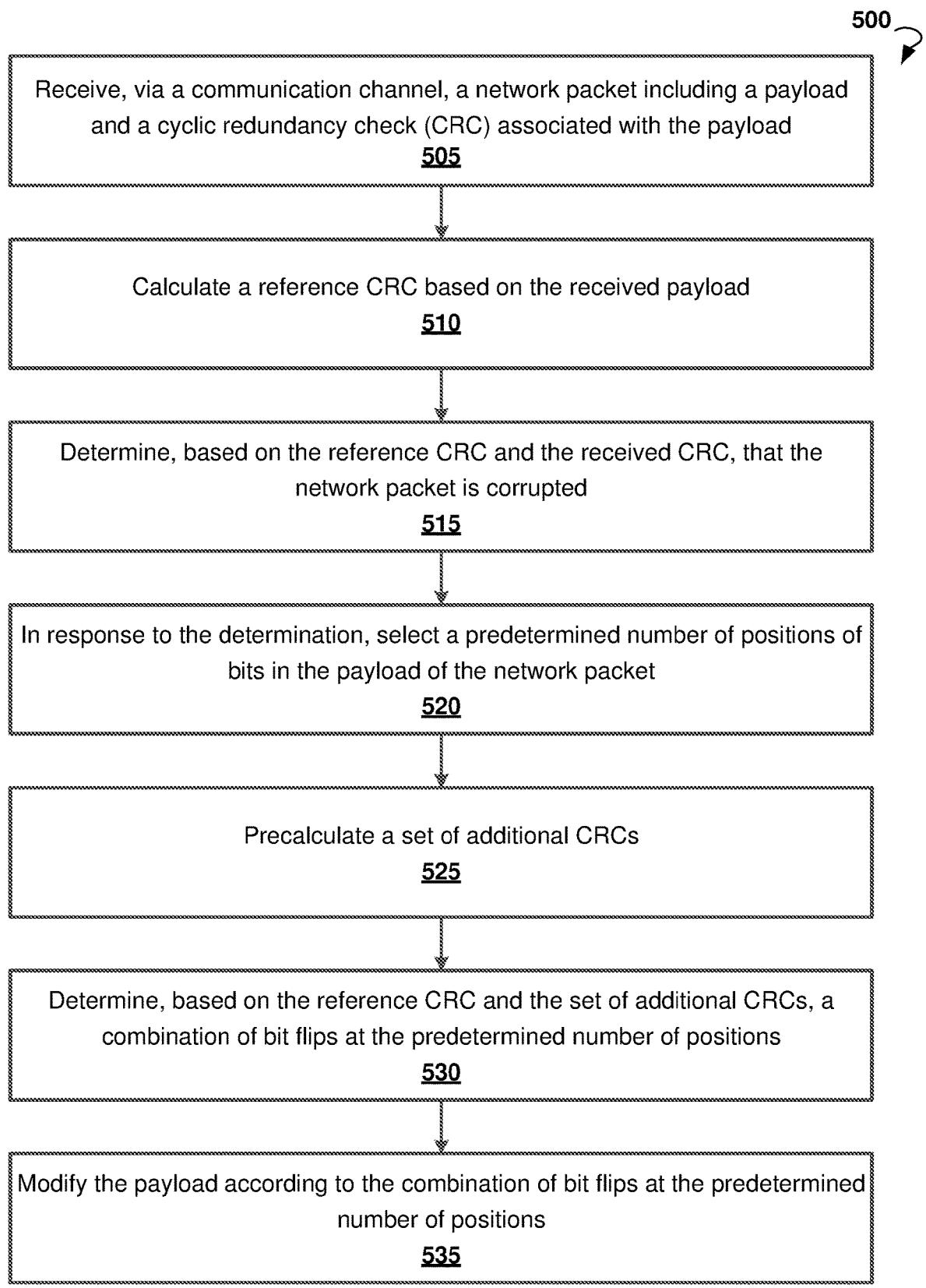
FIG. 5 is a flow chart showing a method for correcting corrupted network packets using linearity of a CRC, according to various example embodiments of the present disclosure.

FIG. 5 is a flow chart a method 500 for error correction in network packets using linearity of a CRC, according to various example embodiments. The method 500 can be implemented as instructions stored in a memory of a user device which, when being executed by the processors of the user device, may cause the user device to perform the operations of the method 500. In some embodiments, the operations of method 500 may be combined, performed in parallel, or performed in a different order. The method 500 may also include additional or fewer operations than those illustrated.

The method 500 may commence in block 505 with receiving a network packet via a communication channel. The network packet may include a payload and a CRC associated with the payload. The method 500 may continue in block 510 with calculating a reference CRC based on the received payload. In block 515, the method 500 may include determining, based on the reference CRC and the received CRC, that the network packet is corrupted.

In response to the determination that the network packet is corrupted, the method 500 may continue with selecting a predetermined number of positions of bits in the payload of the network packet, as shown in block 520. The predetermined number of positions of bits in the payload may be less than the length of the payload. In an example embodiment, the predetermined number of positions of bits may be selected based on at least one previous version of the payload transferred over the communication channel.

The method 500 may further include precalculating a set of additional CRCs as shown in block 525. An additional CRC of the set of additional CRCs is calculated based on a sequence of a set of sequences B of bits of a length of the payload. The sequence includes a single non-zero bit at one of the predetermined number of positions. In an example embodiment, the calculation of the additional CRC of the set of additional CRCs requires fewer operations than a calculation of the reference CRC. The set of additional CRCs may be obtained from a set of precalculated CRCs for sequences of bits of a length of the payload. Each of the sequences may have a single non-zero bit position.

The method 500 may further include determining, based on the reference CRC and the set of additional CRCs, a combination of bit flips at the predetermined number of positions, as shown in block 530. The combination of bit flips corresponds to a combination of the sequences B such thus a sum of the reference CRC and CRCs of the combination of the sequences B matches the received CRC. In an example embodiment, the determination of the combination of bit flips may include iteratively performing the following operations. First, a test combination of the sequences B is selected. Second, a test sum of the reference CRC and the additional CRCs corresponding to the test combination sequences B are calculated. Third, it is determined whether the test sum matches the received CRC.

In an example embodiment, the determination of the combination of bit flips may include generating a set of linear equations. A linear equation of the set of linear equations may correspond to one of possible combinations of the sequences B. The set of linear equations may be solved to determine the combination of the sequences B. In an example embodiment, the set of linear equations may be solved by a Gaussian elimination method. In block 535, the method 500 may include modifying the payload according to the combination of bit flips at the predetermined number of positions.

In an example embodiment, after selecting the predetermined number of positions of bits in the payload of the network packet, the method 500 may further include calculating a binary tree. Nodes of the binary tree may correspond to CRCs of parts of the payload and leaves of the binary tree may correspond to CRCs of payloads modified according to possible combinations of bit flips at the predetermined positions. Upon calculation of the binary tree, the combination of the bit flips corresponding to CRC matching the received CRC is selected based on the leaves. Each of the nodes of the binary tree corresponds to a first branch and a second branch. The first branch corresponds to a first partial payload obtained by flipping a bit at one of the predetermined positions. The second branch corresponds to a second partial payload having the bit at the one of the predetermined positions unchanged.

Figure 6:
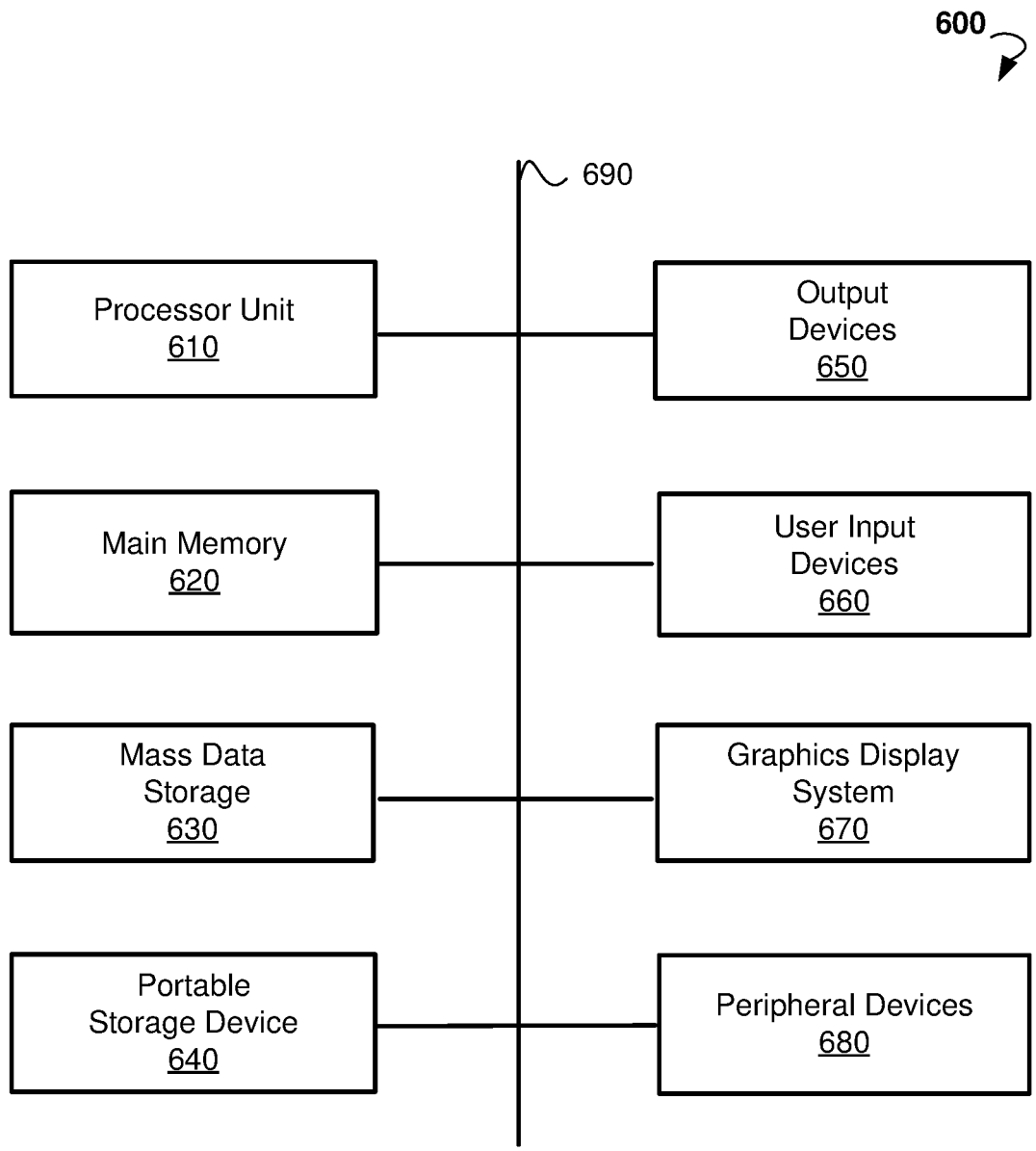
FIG. 6 shows a computing system that can be used to implement a system and a method for error correction in network packets using linearity of a CRC, according to an example embodiment.

FIG. 6 illustrates an exemplary computer system 600 that may be used to implement some embodiments of the present invention. The computer system 600 of FIG. 6 may be implemented in the contexts of computing systems, networks, servers, transmitters, receivers, or combinations thereof. The computer system 600 of FIG. 6 includes one or more processor units 610 and main memory 620. Main memory 620 stores, in part, instructions and data for execution by processor units 610. Main memory 620 stores the executable code when in operation, in this example. The computer system 600 of FIG. 6 further includes a mass data storage 630, portable storage device 640, output devices 650, user input devices 660, a graphics display system 670, and peripheral devices 680.

The components shown in FIG. 6 are depicted as being connected via a single bus 690. The components may be connected through one or more data transport means. Processor unit 610 and main memory 620 is connected via a local microprocessor bus, and the mass data storage 630, peripheral device(s) 680, portable storage device 640, and graphics display system 670 are connected via one or more input/output (I/O) buses.

Mass data storage 630, which can be implemented with a magnetic disk drive, solid state drive, or an optical disk drive, is a non-volatile storage device for storing data and instructions for use by processor unit 610. Mass data storage 630 stores the system software for implementing embodiments of the present disclosure for purposes of loading that software into main memory 620.

Portable storage device 640 operates in conjunction with a portable non-volatile storage medium, such as a flash drive, floppy disk, compact disk, digital video disc, or USB storage device, to input and output data and code to and from the computer system 600 of FIG. 6. The system software for implementing embodiments of the present disclosure is stored on such a portable medium and input to the computer system 600 via the portable storage device 640.

User input devices 660 can provide a portion of a user interface. User input devices 660 may include one or more microphones, an alphanumeric keypad, such as a keyboard, for inputting alphanumeric and other information, or a pointing device, such as a mouse, a trackball, stylus, or cursor direction keys. User input devices 660 can also include a touchscreen. Additionally, the computer system 600 as shown in FIG. 6 includes output devices 650. Suitable output devices 650 include speakers, printers, network interfaces, and monitors.

Graphics display system 670 include a liquid crystal display or other suitable display device. Graphics display system 670 is configurable to receive textual and graphical information and processes the information for output to the display device.

Peripheral devices 680 may include any type of computer support device to add additional functionality to the computer system.

The components provided in the computer system 600 of FIG. 6 are those typically found in computer systems that may be suitable for use with embodiments of the present disclosure and are intended to represent a broad category of such computer components that are well known in the art. Thus, the computer system 600 of FIG. 6 can be a personal computer (PC), handheld computer system, telephone, mobile computer system, workstation, tablet, phablet, mobile phone, server, minicomputer, mainframe computer, wearable, an Internet of things device/system, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, and other suitable operating systems.

The processing for various embodiments may be implemented in software that is cloud-based. In some embodiments, the computer system 600 is implemented as a cloud-based computing environment, such as a virtual machine operating within a computing cloud. In other embodiments, the computer system 600 may itself include a cloud-based computing environment, where the functionalities of the computer system 600 are executed in a distributed fashion. Thus, the computer system 600, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud may be formed, for example, by a network of web servers that comprise a plurality of computing devices, such as the computer system 600, with each server (or at least a plurality thereof) providing processor and/or storage resources. These servers may manage workloads provided by multiple users (e.g., cloud resource customers or other users). Typically, each user places workload demands upon the cloud that vary in real-time, sometimes dramatically. The nature and extent of these variations typically depends on the type of business associated with the user.

Thus, systems and methods for correcting corrupted network packets using linearity of a CRC have been described. Although embodiments have been described with reference to specific example embodiments, it will be evident that various modifications and changes can be made to these example embodiments without departing from the broader spirit and scope of the present application. Accordingly, the specification and drawings are to be regarded in an illustrative rather than a restrictive sense.

What is claimed is:

1. A system for correcting corrupted network packets, the system comprising:
   at least one processor; and
   a memory communicatively coupled to the at least one processor, the memory storing instructions executable by the at least one processor to perform a method comprising:
      receiving, via a communication channel, a network packet including a payload and a cyclic redundancy check (CRC) associated with the payload;
      calculating a reference CRC based on the received payload;
      determining, based on the reference CRC and the received CRC, that the network packet is corrupted; and
      receiving a sequence of a set of sequences, which is an output of a neural packet processor, the sequence having bits of a length for a portion of the payload;
      selecting a predetermined number of positions of bits in the payload of the network packet;
      precalculating a set of additional CRCs, wherein an additional CRC of the set of additional CRCs is calculated based on the sequence of the set of sequences, the sequence of the set of sequences including a single non-zero bit at one of the predetermined number of positions, as well as sequential three-byte XOR operations;
      determining, based on the reference CRC and the set of additional CRCs, a combination of bit flips at the predetermined number of positions, the combination of bit flips corresponding to a combination of the set of sequences such that a sum of the reference CRC and CRCs of the combination of the set of sequences matches the received CRC;
      generating a modified payload according to the combination of bit flips at the predetermined number of positions; and
      transmitting the network packet with the modified payload to a receiver over a wireless network.

2. The system of claim 1, wherein the predetermined number of positions of bits in the payload is fewer than a length of the payload.

3. The system of claim 1, wherein calculation of an additional CRC of the set of additional CRCs requires less operations than the calculation of the reference CRC.

4. The system of claim 1, wherein the set of additional CRCs is obtained from a set of precalculated CRCs for each of the set of sequences, each of the set of sequences having a single non-zero bit position.

5. The system of claim 1, wherein the determining the combination of bit flips includes iteratively:
   selecting a test combination sequence of the set of sequences;
   calculating a test sum of the reference CRC and the set of additional CRCs corresponding to the test combination sequence; and
   determining whether the test sum matches the received CRC.

6. The system of claim 1, wherein the determining the combination of bit flips includes:

generating a set of linear equations, wherein a linear equation of the set of linear equations corresponds to one of possible combinations of the set of sequences; and solving the set of linear equations to determine the combination of the set of sequences.

7. The system of claim 6, wherein the set of linear equations is solved by a Gaussian elimination method.

8. The system of claim 1, wherein the predetermined number of positions of bits are selected based on at least one previous version of the payload transferred via the communication channel.

9. A method for correcting corrupted network packets, the method comprising:

receiving, via a communication channel, a network packet including a payload and a cyclic redundancy check (CRC) associated with the payload;

calculating a reference CRC based on the received payload;

determining, based on the reference CRC and the received CRC, that the network packet is corrupted;

receiving a sequence of a set of sequences, which is an output of a neural packet processor, the sequence having bits of a length for a portion of the payload;

selecting a predetermined number of positions of bits in the payload of the network packet;

precalculating a set of additional CRCs, wherein an additional CRC of the set of additional CRCs is calculated based on the sequence of the set of sequences, the sequence of the set of sequences including a single non-zero bit at one of the predetermined number of positions, as well as sequential three-byte XOR operations;

determining, based on the reference CRC and the set of additional CRCs, a combination of bit flips at the predetermined number of positions, the combination of bit flips corresponding to a combination of the set of sequences such that a sum of the reference CRC and CRCs of the combination of the set of sequences matches the received CRC;

generating a modified payload according to the combination of bit flips at the predetermined number of positions; and transmitting the network packet with the modified payload to a receiver over a wireless network.

10. The method of claim 9, wherein the predetermined number of positions of bits in the payload is less than a length of the payload.

11. The method of claim 9, wherein the calculation of the additional CRC of the set of additional CRCs requires fewer operations than the calculation of the reference CRC.

12. The method of claim 9, wherein the set of additional CRCs is obtained from a set of precalculated CRCs for each of the set of sequences, each of the set of sequences having a single non-zero bit position.

13. The method of claim 9, wherein the determining the combination of bit flips includes iteratively:

selecting a test combination sequence of the set of sequences;

calculating a test sum of the reference CRC and the set of additional CRCs corresponding to the test combination sequence; and determining whether the test sum matches the received CRC.

14. The method of claim 9, wherein the determining the combination of bit flips includes:

generating a set of linear equations, wherein a linear equation of the set of linear equations corresponds to one of possible combinations of the set of sequences; and solving the set of linear equations to determine the combination of the set of sequences.

15. The method of claim 14, wherein the set of linear equations is solved by a Gaussian elimination method.

16. The method of claim 9, wherein the predetermined number of positions of bits are selected based on at least one previous version of the payload transferred over the communication channel.

* * * * *